(12) United States Patent
Hill

(10) Patent No.: US 6,525,545 B2
(45) Date of Patent: Feb. 25, 2003

(54) FREQUENCY DOMAIN REFLECTION MEASUREMENT DEVICE

(75) Inventor: Thomas C. Hill, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/796,564

(22) Filed: Feb. 28, 2001

(65) Prior Publication Data
US 2002/0118024 A1 Aug. 29, 2002

(51) Int. Cl.[7] .......................... G01R 27/04; G01R 27/32
(52) U.S. Cl. .................................. 324/642; 342/118
(58) Field of Search ................................. 324/603, 642, 324/646; 342/118, 125, 145, 165

(56) References Cited

U.S. PATENT DOCUMENTS 5,805,105 A  *  9/1998  Coveley ...................... 342/125
6,268,735 B1 *  7/2001  Craig et al. .................. 324/603
6,366,097 B1 *  4/2002  Harrison ...................... 324/646

* cited by examiner

Primary Examiner—Christine Oda
Assistant Examiner—Etienne LeRoux
(74) Attorney, Agent, or Firm—Francis I. Gray

(57) ABSTRACT

A frequency domain measurement device multi-phase modulates an RF frequency signal with a broadband signal, such as a pseudo random number, to produce an RF spread spectrum signal that encompasses a frequency range of interest. The RF spread spectrum signal is transmitted to a device under test, and a corresponding reflected signal from the device under test is correlated with the RF spread spectrum signal to produce information from which location of and distance to a fault in the device under test may be determined. A FIR filter is used as part of the correlation process to determine magnitude and phase versus frequency over the frequency range of interest for the device under test as well as location of and distance to the fault.

10 Claims, 3 Drawing Sheets

FREQUENCY DOMAIN REFLECTION MEASUREMENT DEVICE

BACKGROUND OF THE INVENTION

The present invention relates to radio frequency measurement devices, and more particularly to a frequency domain reflection measurement device for detecting impedance changes and locations as well as frequency characteristics in a communications system.

Radio frequency (RF) communications components, particularly antennas and feedlines, may be improperly installed or may degrade with time. These degradations exhibit impedances that are different from an originally specified characteristic impedance of a transmission system. Measurement of these different impedances, either voltage standing wave ratio (VSWR) or return loss, and measurements of the distance from a measurement point to a point of erroneous impedance are needed before repair may begin. Identification of small degradations that have not yet caused catastrophic failure allows for preventative maintenance. In an ideal transmission line system the load of the system matches the characteristic impedance of the system, and a test signal injected at one end is absorbed completely by the load at the other end. However if there are impedance mismatches in the system, these mismatches cause a portion of the test signal to be reflected back to the source as a return signal. The amount of the magnitude of the return signal below the magnitude of the injected test signal is termed "return loss."

For example, in cellular telephone installations it is often desired to determine if transmission lines to the antenna plus the antennas themselves are undamaged. Today this test is performed using miniature, hand-held vector network analyzers (VNAs) to measure RF characteristics of the lines and antennas. Such a VNA is the Anritsu/Wiltron Sitemaster analog swept measurement device, as shown in FIG. 1. A swept frequency signal from an RF source is used to determine distance and type of problem by looking at the amplitude and phase of the return to generate a "goodness" plot of the system under test within a frequency range of interest, as shown in FIG. 2, and by using an inverse Fast Fourier Transform (FFT$^{-1}$) to convert to the time domain to determine distance. In order to increase the accuracy of detecting a fault and to increase the resolution of the distance to the fault the sweep of the swept frequency is increased over a wider range than just the frequency range of interest.

What is desired is a measurement instrument for measuring and locating changes in impedance in a transmission system which has a high dynamic range and provides accurate measurements.

BRIEF SUMMARY OF THE INVENTION

Accordingly the present invention provides a frequency domain measurement device that generates a spread spectrum RF signal as a test signal that is transmitted to a device under test. A corresponding return signal from the device under test due to impedance mismatches or faults which cause reflections is correlated with the spread spectrum signal to obtain the location of and distance to the faults. A broadband signal source, such as a pseudo random number generator, is used to modulate an RF signal to generate the spread spectrum RF signal. A delayed pseudo random number generator or the equivalent may be used to correlate with the return signal, the amount of delay between transmit signal correlation and return signal correlation being indicative of the distance to an impedance mismatch. The delayed pseudo random number generator may be accomplished with a FIR filter in an error minimization loop, with the tap values of the FIR filter being processed to produce both a frequency characteristic for the device under test as well as the location of and distance to the impedance mismatches.

The objects, advantages and other novel features of the present invention are apparent from the following detailed description when read in conjunction with the appended claims and attached drawing.

DETAILED DESCRIPTION OF THE INVENTION

Figure 1:
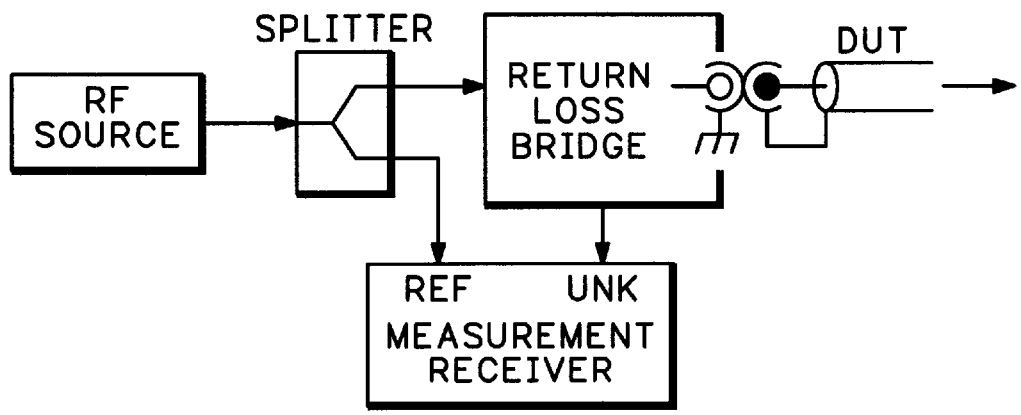
FIG. 1 is a block diagram view of a prior art vector network analyzer for measuring characteristics of a transmission system using an analog swept measurement technique.
Figure 2:
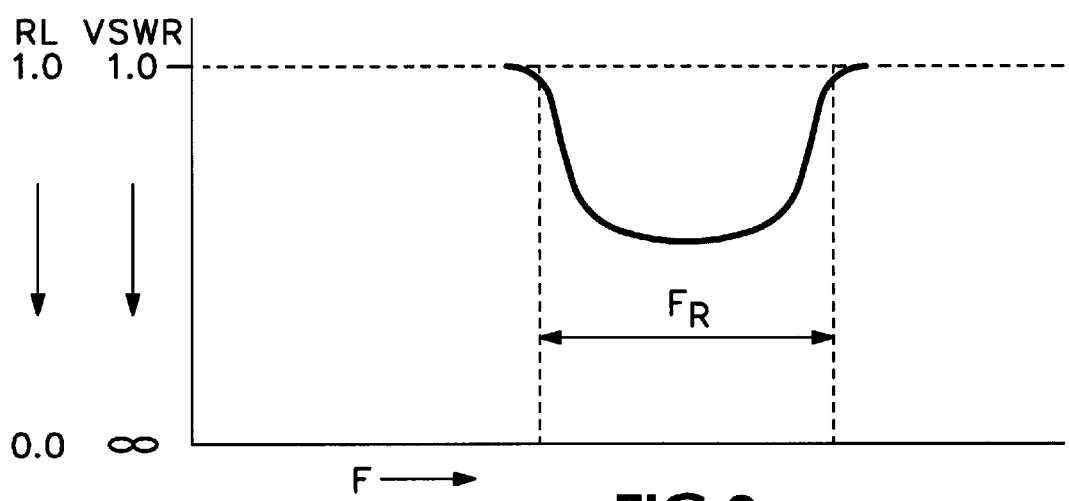
FIG. 2 is a graphical diagram view of magnitude/phase versus frequency for determining "goodness" of a communications antenna/feedline.
Figure 3:
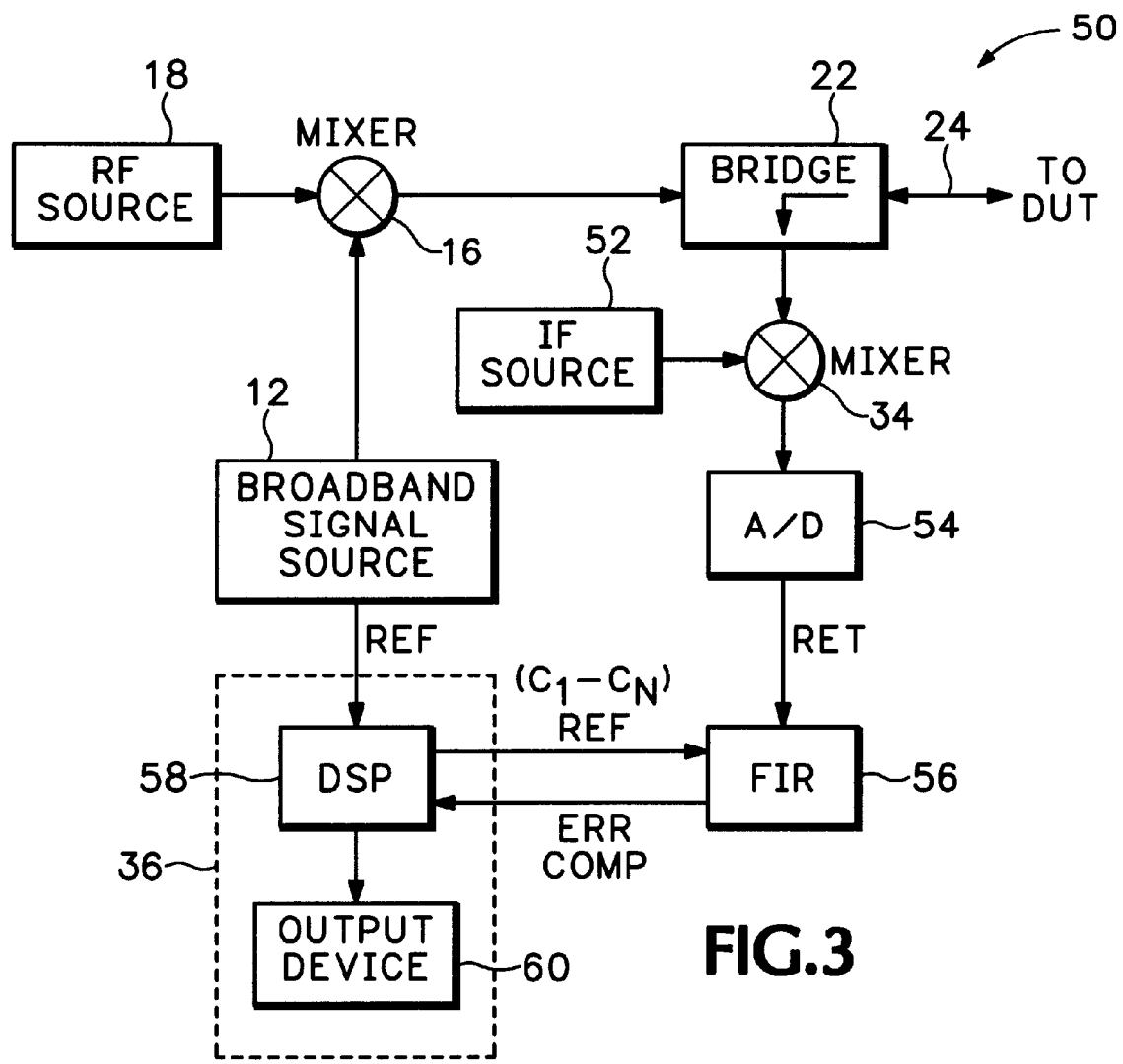
FIG. 3 is a block diagram view of a frequency domain measurement device according to the present invention.

Referring now to FIG. 3 multi-phase modulation is added to the prior art of FIG. 1 by a broadband signal source 12, such as a pseudo-random number (PRN) generator, which modulates an RF source 18 via a first mixer or modulator 16 so that a spread spectrum signal is formed with the RF source frequency at its center. The RF source frequency is adjusted to the center of a band of frequencies of interest. If the band exceeds the width of the spread spectrum signal, then multiple measurements may be made while stepping, rather than sweeping, the RF source 18 across the band of interest. Although a bridge 22 is not necessary, it may be used to increase the dynamic range of the system. The spread spectrum signal is transmitted over a transmission line 24 to a device under test (DUT). A return signal resulting from reflections due to impedance mismatches in the DUT is down converted by an IF source 52 and second mixer 34, if necessary, and digitized by an A/D converter 54. The down conversion may not be necessary if the A/D converter 54 is fast enough to digitize at the RF frequency of the RF source 18. A FIR filter 56, or similar circuitry, in an error minimization loop locates a time offset of reflections in the return signal comparable to using a delayed PRN generator. The tap values of the FIR filter 56 also provide magnitude and phase information versus frequency. The output from the FIR filter 56 is input to a digital signal processor (DSP) 58 in a receiver 36 together with the reference code from the broadband signal source 12. The frequency response of the return signal is compared to the known response of the signal source to estimate the magnitude and phase of the impedance mismatches. This may be done by reading the tap settings of the FIR filter 56 and computing the frequency response, as explained below. This is a measurement of $S_{11}$ of a system, in similar form to the more common measurement of $S_{21}$ using a digital PRN code. Further the reception of the reference code may be performed remotely from the source, allowing through measurements of transmission lines and other communications components. Distance to fault is still measured with this technique, again by analyzing the tap values of the FIR filter 56.

Figure 4:
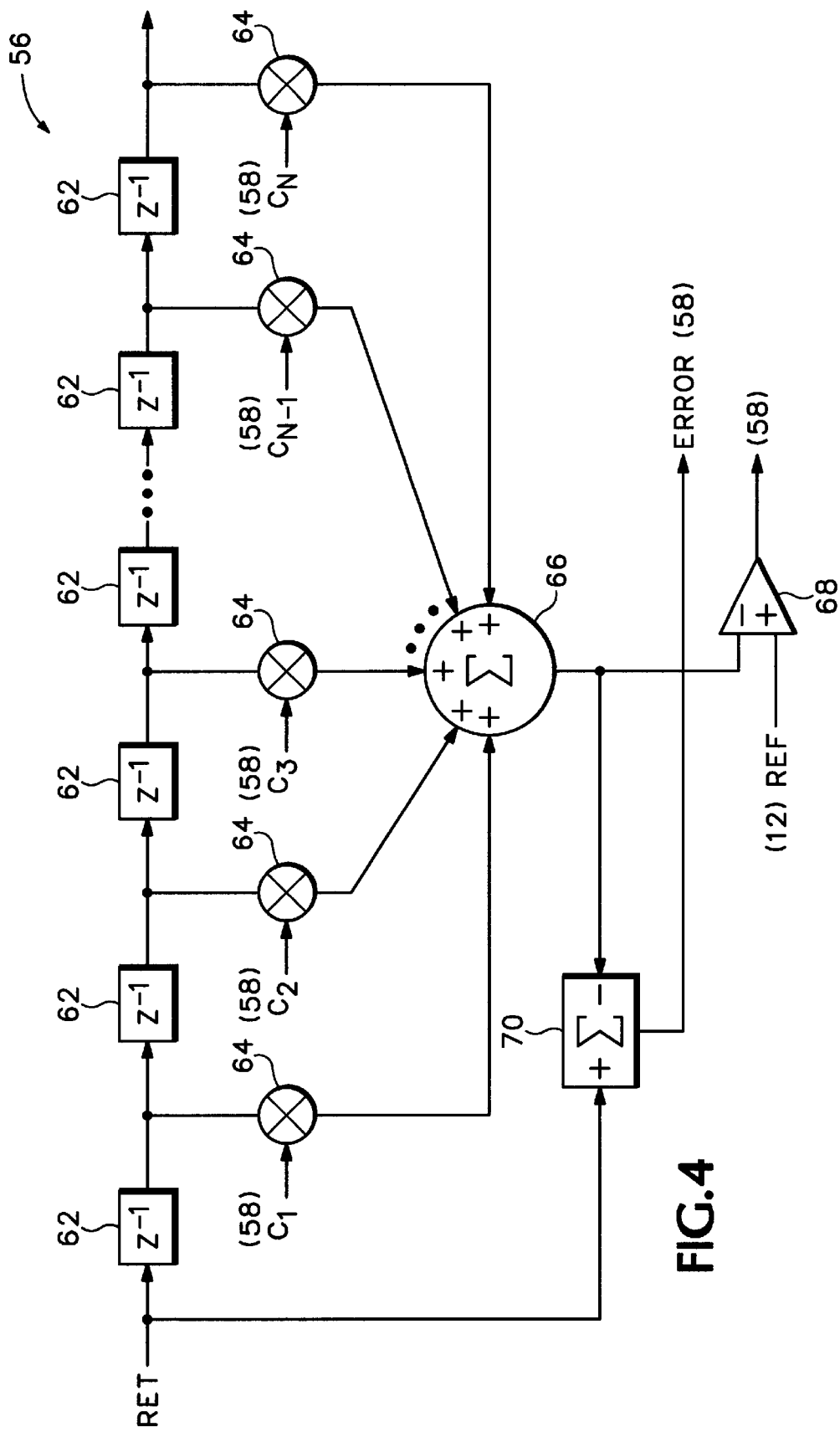
FIG. 4 is a block diagram view of a FIR filter in an error minimization loop according to the present invention.

Referring now to FIG. 4 the FIR filter 56 has a plurality of delay elements 62 coupled in series. The output of each delay element 62 is input to a multiplier 64 to which also is input a corresponding filter coefficient $C_1$–$C_n$, the set of filter coefficients defining a vector. The outputs from the multipliers 64 are input to a summation circuit 66 to provide a filtered output. The filtered output from the summation circuit 66 is input to a comparator 68 and to a subtractor 70. The other input to the comparator 68 is the reference signal from the broadband signal source 12 via the DSP 58, and the output from the comparator is input back to the DSP as an error signal. The DSP 58 uses an appropriate algorithm, such as a least means squares algorithm, to adjust the filter coefficients until the error signal is at a minimum or below a specified threshold. At that point the DSP 58 samples the output of the subtractor 70 which is the error difference between the reference and return signals. From the tap coefficients at that point the DSP 58 determines the magnitude and phase with respect to frequency for the DUT as well as the presence of a fault and the distance to the fault. The results are provided on an output device 60.

Thus the present invention provides a frequency domain reflection measurement device that modulates an RF source signal to produce a spread spectrum RF signal across a desired frequency range that is injected into a device under test and correlates the return signal from the device under test with the modulating signal to determine the location and distance to a fault and, from the taps of a FIR filter, the magnitude and phase versus frequency for the device under test.

What is claimed is:

1. A frequency domain reflection measurement device comprising:
    means for generating an RF spread spectrum signal covering a frequency range of interest for transmission to a device under test; and
    means for correlating a return signal produced by a reflection from the device under test in response to the RF spread spectrum signal with a modulating signal used to generate the RF spread spectrum signal to detect the location of and distance to a fault in the device under test represented by the reflection.

2. The frequency domain reflection measurement device as recited in claim 1 wherein the correlating means comprises:
    a FIR filter in an error minimization loop having as an input the return signal, a reference signal corresponding to the modulating signal and a filter coefficient vector; and
    a digital signal processing device having as inputs the modulating signal and an output from the FIR filter, the digital signal processing device adjusting the filter coefficient vector to minimize an error signal portion of the FIR filter output and determining from the filter coefficient vector, when the error signal portion is at a minimum, a magnitude and phase versus frequency relationship for the device under test.

3. The frequency domain reflection measurement device as recited in claim 2 wherein the FIR filter comprises:
    a plurality of delay devices coupled in series having the return signal as an input;
    a plurality of multipliers coupled to respective outputs of the delay devices and having a filter coefficient from the filter coefficient vector as an input to provide a tap output for the output of each delay device;
    means for summing the tap outputs from the multipliers to produce an initial FIR filter output; and
    means for comparing the initial FIR filter output with the reference signal to produce the error signal portion.

4. The frequency domain reflection measurement device as recited in claim 3 wherein the FIR filter further comprises means for subtracting the initial FIR filter output from the return signal to generate an error difference signal as a portion of the FIR filter output for input to the DSP such that when the error is signal portion is at the minimum the DSP may determine from the error difference signal the location of and distance to the fault in the device under test.

5. A method of locating and determining distance to a fault in a device under test comprising the steps of:
    generating an RF spread spectrum signal covering a frequency range of interest for injection into the device under test; and
    correlating a return signal produced by a reflection from the device under test in response to the RF spread spectrum signal with a modulating signal used in the generating step to produce the RF spread spectrum signal to detect the location of and distance to the fault in the device under test represented by the reflection.

6. The method as recited in claim 5 wherein the correlating step comprises the steps of:
    inputting the return signal to a FIR filter in an error minimization loop, the FIR filter also having a reference signal corresponding to the modulating signal and a filter coefficient vector as inputs; and
    digital signal processing an output signal from the FIR filter and the modulating signal including the steps of adjusting the filter coefficient vector to minimize an error signal portion of the FIR filter output signal and determining from the filter coefficient vector, when the error signal portion is at a minimum, a magnitude and phase versus frequency relationship for the device under test.

7. The method as recited in claim 6 wherein the inputting step comprises the steps of:
    summing tap outputs from the FIR filter, each tap output representing the multiple of a filter coefficient from the filter coefficient vector with a respective delayed version of the return signal, to produce an initial FIR filter output; and
    comparing the initial FIR filter output with the reference signal to produce the error signal portion.

8. The method as recited in claim 7 wherein the inputting step further comprises the step of subtracting the initial FIR filter output from the return signal to generate an error difference signal as a further portion of the FIR filter output signal for input to the digital signal processing step so that, when the error signal portion is at the minimum, the digital signal processing step determines from the error difference signal the location of and distance to the fault in the device under test.

9. An improved frequency domain reflection measurement device for determining location of and distance to a fault in a device under test, the measurement device being of the type having an RF source coupled to transmit an excitation signal to the device under test and having means for comparing the excitation signal with a return signal from the device under test, the return signal indicating the fault as a reflection in response to the excitation signal, wherein the improvement comprises:
    means for generating as the excitation signal an RF spread spectrum signal for transmission to the device under test, the RF spread spectrum signal being derived from the RF source in response to a modulating signal and covering a frequency range of interest; and means for correlating, as the comparing means, the return signal with the modulating signal to detect the location of and distance to the fault.

10. An improved method of locating and determining distance to a fault in a device under test where the fault is represented by a reflection in a return signal produced in response to an excitation signal injected into the device under test, wherein the improvement comprises the steps of:

generating as the excitation signal an RF spread spectrum signal as a function of a modulating signal covering a frequency range of interest for injection into the device under test; and correlating the return signal with the modulating signal to detect the location of and distance to the fault in the device under test.

\* \* \* \* \*